(12) United States Patent  
Briceno

(10) Patent No.: US 8,436,444 B2
(45) Date of Patent: May 7, 2013

(54) THIN FILM PHOTOELECTRIC CONVERSION DEVICE AND METHOD FOR MANUFACTURING THIN FILM PHOTOELECTRIC CONVERSION DEVICE

(75) Inventor: Jose Briceno, Tokyo (JP)

(73) Assignee: Si-Nano Inc., Tokyo (JP)

( * ) Notice: Subject to any disclaimer, the term of this patent is extended or adjusted under 35 U.S.C. 154(b) by 230 days.

(21) Appl. No.: 12/681,091

(22) PCT Filed: Dec. 10, 2008

(86) PCT No.: PCT/JP2008/003686
§ 371 (c)(1),
(2), (4) Date: Mar. 31, 2010

(87) PCT Pub. No.: WO2010/067398
PCT Pub. Date: Jun. 17, 2010

(65) Prior Publication Data
US 2011/0272771 A1 Nov. 10, 2011

(51) Int. Cl.
*H01L 31/18* (2006.01)
(52) U.S. Cl.
USPC .................... 257/456; 257/432; 257/E31.127
(58) Field of Classification Search .................. 257/449, 257/450, 454, 456, E31.127, 432
See application file for complete search history.

(56) References Cited

U.S. PATENT DOCUMENTS

| | | | |
|---|---|---|---|
| 5,140,381 A | 8/1992 | Badoz et al. | |
| 5,859,464 A | 1/1999 | Hollricher et al. | |
| 6,441,298 B1 * | 8/2002 | Thio | 136/250 |

(Continued)

FOREIGN PATENT DOCUMENTS

| | | |
|---|---|---|
| JP | 1-160010 A | 6/1989 |
| JP | 5-322646 A | 12/1993 |

(Continued)

OTHER PUBLICATIONS

International Search Report of PCT/JP2008/003686, mailing date of Jan. 27, 2009.

*Primary Examiner* — John C Ingham
(74) *Attorney, Agent, or Firm* — Westerman, Hattori, Daniels & Adrian, LLP

(57) ABSTRACT

A thin film photoelectric conversion device for performing photoelectric conversion of a wide range of light, from the visible range to the infrared range, is provided. A plasmon resonance phenomenon, which enhances a photo-induced electric field, is caused in a wide range of light, by a metal nanostructure which is formed by annealing a substrate on which a first metal thin film layer composed of a first metal and a second metal thin film layer composed of a second metal which is partially overlapped onto the first metal thin film layer are laminated, and in which a periodic structure, wherein a number of first convex parts successively lie with a pitch of from one-tenth of a wavelength of an incident light to a wavelength equal to or shorter than the wavelength of the incident light in a planar direction along the substrate, is formed on the surface of the substrate; and a random structure, wherein a distance between any pair of a number of second convex parts formed at random positions on the substrate, or a distance between a second convex part and a first convex part is shorter than 100 nm, is formed on the substrate in a position within a region of the periodic structure or in a position adjacent to the region of the periodic structure, and as a result, high sensitivity photo-induced current is generated.

10 Claims, 7 Drawing Sheets

U.S. PATENT DOCUMENTS

| | | | |
|---|---|---|---|
| 8,013,992 B2 * | 9/2011 | Biris et al. | 356/301 |
| 2003/0218744 A1 * | 11/2003 | Shalaev et al. | 356/301 |
| 2006/0219293 A1 | 10/2006 | Morooka et al. | |
| 2008/0023779 A1 | 1/2008 | Usuki | |
| 2010/0177384 A1 * | 7/2010 | Peroz et al. | 359/487 |

FOREIGN PATENT DOCUMENTS

| | | |
|---|---|---|
| JP | 6-147993 A | 5/1994 |
| JP | 6-151809 A | 5/1994 |
| JP | 9-510832 | 10/1997 |
| JP | 11-251241 A | 9/1999 |
| JP | 2006-278878 A | 10/2006 |
| JP | 2007-96136 A | 4/2007 |
| WO | 2006-085670 A1 | 8/2006 |
| WO | 2006/095381 A1 | 9/2006 |
| WO | WO2008142322 * | 11/2008 |

* cited by examiner

THIN FILM PHOTOELECTRIC CONVERSION DEVICE AND METHOD FOR MANUFACTURING THIN FILM PHOTOELECTRIC CONVERSION DEVICE

TECHNICAL FIELD

The present invention relates to a thin film photoelectric conversion device and a method for manufacturing the thin film photoelectric conversion device, and more particularly, to a thin film photoelectric conversion device which causes generation of photocarriers on a surface of the device and a method for manufacturing the thin film photoelectric conversion device.

BACKGROUND ART

Many of the photoelectric conversion devices used for optical sensors or solar cells use semiconductor crystals such as Si and GaAs, and require precise doping control, control of a pn junction interface or a Schottky interface, and microstructure fabrication techniques.

Further, many of the photoelectric conversion devices used for solar cells are pn-junction-type photoelectric conversion devices formed on Si substrates, and their availability for use is limited to sunlight having wavelengths equal to or shorter than 1.2 µm due to the band gap of Si, and therefore, they are mainly used for performing photoelectric conversion of visible light having wavelengths equal to or shorter than 0.8 µm.

On the other hand, with regard to the photoelectric conversion devices used for optical sensors, a high speed optical sensor in which a Au metal layer with a thickness equal to or greater than several micrometers is laminated on an n-type Si has been known since the 1960's as a sensor for detecting light in the visible range. In addition, various kinds of Schottky type photoelectric conversion devices which respond to light in the infrared range are known, including an optical sensor for detecting light having wavelength bands of from 1 to 2 µm, composed of $CoSi_2$ (polycrystal)/n-Si (Non-Patent Document 4), an optical sensor for detecting light having wavelength bands of from 1 to 5 µm, composed of $CoSi_2$/p-SiGe (Non-Patent Document 2), an optical sensor for detecting light having wavelength bands of from 1 to 6 µm, composed of Pt/p-Si (Non-Patent Document 3), and an optical sensor capable of detecting light having wavelength bands of up to 10 µm, composed of Ir/Si (Non-Patent Document 4).

Non-Patent Document 1

Roca, Elisenda, et al., Proceedings of SPIE—The International Society for Optical Engineering 2552 (2), 456 (1995)

Non-Patent Document 2

S. Kolondinski, et al., Proceedings of SPIE—The International Society for Optical Engineering 2554, 175 (1995)

Non-Patent Document 3

J. M. Mooney and J. Silverman, IEEE Trans. Electron Devices ED-32, 33-39 (1985)

Non-Patent Document 4

B-Y. Tsaur, M. M. Weeks, R. Trubiano and P. W. Pellegrini, IEEE Electron Device Left. 9, 650-653 (1988)

DISCLOSURE OF INVENTION

Problems to be Solved by the Invention

However, no matter what purpose it is used for, there is no known photoelectric conversion device which can detect light, from the visible light range having wavelengths of about 500 nm to the infrared range having wavelengths equal to or longer than 900 µm. This is because of the following reason: as long as photocarriers are generated by taking advantage of a band gap, carriers are not induced by light having a photon energy equal to or lower than the band gap; on the other hand, when the photon energy exceeds a predetermined value, there is no conduction band in which induced carriers are allowed to exist; and therefore, photo-induced current is not generated in each case and availability for use of conventional photoelectric conversion devices is limited to wavelength bands having a photon energy within a certain range.

Further, the above-described photoelectric conversion device for performing photoelectric conversion of light in the infrared range requires use of harmful substances or operation in cryogenic environments, which becomes obstacles when the device is put into practical use for the purpose of being used for solar cells or optical sensors.

Furthermore, manufacture of the photoelectric conversion device requires complex and precise semiconductor process control including precise p/n doping control and control of a pn junction interface or a Schottky interface, as well as use of large amounts of scarce elements.

The present invention has been made in consideration of such conventional problems, and is aimed at providing a thin film photoelectric conversion device for performing photoelectric conversion of a wide range of light, from the visible range to the infrared range, and a method for manufacturing the thin film photoelectric conversion device.

In addition, the present invention is aimed at providing a thin film photoelectric conversion device which can be manufactured through simple processes with the use of very small amount of scarce elements and a method for manufacturing the thin film photoelectric conversion device.

Means for Solving the Problems

In order to achieve the above-described aims, the thin film photoelectric conversion device according to claim 1 is characterized in that it comprises a metal nanostructure composed of a number of metal clusters or metal fractal structures formed on a substrate, and that:

the metal nanostructure has the following structure: a periodic structure, wherein a number of first convex parts successively lie with a pitch of from one-tenth of a wavelength of an incident light to a wavelength equal to or shorter than the wavelength of the incident light in a planar direction along the substrate, is formed on the substrate; and a random structure, wherein a distance between any pair of a number of second convex parts formed at random positions on the substrate, or a distance between a second convex part and a first convex part is shorter than 100 nm, is formed on the substrate in a position within a region of the periodic structure or in a position adjacent to the region of the periodic structure.

In the metal nanostructure, a number of metal clusters or metal fractal structures are formed on the substrate and thereby an M-I-M structure is formed along the plane of the substrate. An energy gap is present therebetween, and a photo-induced electric field is generated in a planar direction upon receiving light. The photo-induced electric field is enhanced, by several orders of magnitude, because a plasmon resonance phenomenon is caused by the periodic structure wherein a number of first convex parts successively lie with a pitch of from one-tenth of a wavelength of an incident light to a wavelength equal to or shorter than the wavelength of the incident light in a planar direction along the substrate. Further, as the random structure, wherein a distance between second convex parts or a distance between a second convex part and a first convex part is shorter than 100 nm, is present in a random position within a region of the periodic structure or in a random position adjacent to the region of the periodic structure, the photo-induced electric field is concentrated in a space between such convex parts in the random structure by near field interaction, and is further enhanced. Because of the enhancement of the photo-induced electric field, carriers respond even to weak light, and as a result, high sensitivity photovoltaic power is generated.

The enhancement of an electric field caused by plasmon resonance depends on a pitch of the first convex parts on the substrate surface, or aspect ratio, calculated from a first height from the substrate surface and a distance in a planar direction, and a wavelength of light which causes the enhancement of the photo-induced electric field varies between regions of the periodic structure in which the pitches of the first convex parts or the heights of the first convex parts from the substrate surface are different from one another. As a number of the second convex parts are formed at random positions on the substrate, in the case where a random structure wherein a distance between any pair of the second convex parts or a distance between a second convex part and a first convex part is shorter than 100 nm is present in a position within a region of any periodic structure or in a position adjacent to the region, further enhancement of the photo-induced electric field is brought about by a synergistic effect of the plasmon resonance caused by the periodic structure and the near field interaction. Likewise, in each periodic structure with a pitch which satisfies the requirements for the occurrence of the plasmon resonance, the photo-induced electric field is enhanced by the synergistic effect of the plasmon resonance and the near field interaction, respectively, and consequently, light which causes the enhancement of the photo-induced electric field has broad wavelength bands.

In addition, as the enhanced photo-induced electric field is generated along the surface of the substrate, induced photo-carriers are accelerated along the surface of the substrate, and move at a high speed comparable to the speed of compound semiconductors.

The thin film photoelectric conversion device according to claim 2 is characterized in that a height of the second convex part on the substrate is higher than that of the first convex part.

As the heights from the substrate are different between the first convex part which constitutes the periodic structure and the second convex part which constitutes the random structure, the periodic structure and the random structure are present in a mixed state in the same planar region.

The thin film photoelectric conversion device according to claim 3 is characterized in that the thin film photoelectric conversion device further comprises a conductive thin film layer formed on the substrate continuously with a metal nanostructure, and a first electrode and a second electrode respectively ohmic connected to sites of the conductive thin film layer whose distances from the metal nanostructure are different from each other; and that photo-induced current is generated between the first electrode and the second electrode by light emitted to the metal nanostructure.

A carrier concentration gradient is created depending on a photoexcitation position and an electrode position in the metal nanostructure, and the gradient causes photovoltaic power generated between a pair of electrodes. Consequently, photo-induced current can be output from between the pair of electrodes.

Because majority carriers are generated in the metal nanostructure on the substrate surface, coexistence of p-type and n-type carriers such as those in a p-n junction structure is suppressed, and decrease in photoelectric conversion efficiency due to recombination does not occur. As the conductive thin film layer has a conducting property, conduction losses of photocarriers can be suppressed.

The thin film photoelectric conversion device according to claim 4 is characterized in that the conductive thin film layer is formed on the substrate from a first metal by annealing the substrate on which a first metal thin film layer composed of the first metal and a second metal thin film layer composed of a second metal which is partially overlapped onto the first metal thin film layer are laminated; and that the metal nanostructure is formed continuously with the conductive thin film layer by interdiffusion, which occurs at the annealing, of the first metal and the second metal at the circumference of the second metal thin film layer which forms the first electrode.

The metal nanostructure and the first electrode adjacent to the metal nanostructure are formed in the same process as that for forming the conductive thin film layer from the first metal thin film layer.

The thin film photoelectric conversion device according to claim 5 is characterized in that the substrate is a silicon substrate and the conductive thin film layer is composed of a metal silicide.

A metal silicide comprising the first metal has a conducting property and forms the conductive thin film layer, as well as it serves as an underlayer of the second electrode, and it prevents oxidation of silicon and suppresses excessive diffusion of the second metal into the silicon substrate.

The thin film photoelectric conversion device according to claim 6 is characterized in that the first metal is any of Co, Fe, W, Ni, Al and Ti, and the second metal is any of Au, Ag, Pt, Cu and Pd.

Co, Fe, W, Ni, Al and Ti have high melting points, are excellent in mechanical property at high temperature, and suitable as a material for metal silicides. In addition, Au, Ag, Pt, Cu and Pd, which are noble metals, are chemically stable, hard to combine with Si, and easy to form a metal nanostructure.

The method for manufacturing a thin film photoelectric conversion device according to claim 7 is characterized in that it comprises a first step for forming a first metal thin film layer composed of a first metal on a substrate, a second step for forming a second metal thin film layer composed of a second metal on a part of the first metal thin film layer, and a third step for forming a conductive thin film layer formed from the first metal on the substrate and a second metal-rich metal nanostructure on the conductive thin film layer by annealing the first metal thin film layer and the second metal thin film layer laminated on the substrate; and that the metal nanostructure formed by the third step is constituted by a number of metal clusters or metal fractal structures, and the metal nanostructure has the following structure: a periodic structure, wherein a number of first convex parts successively lie with a pitch of from one-tenth of a wavelength of an incident light to a wavelength equal to or shorter than the wavelength of the incident light in a planar direction along the substrate, is formed on the substrate; and a random structure, wherein a distance between any pair of a number of second convex parts formed at random positions on the substrate, or a distance between a second convex part and a first convex part is shorter than 100 nm, is formed on the substrate in a position within a region of the periodic structure or in a position adjacent to the region of the periodic structure.

The method for manufacturing a thin film photoelectric conversion device according to claim 8 is characterized in that: the second step is for forming the second metal thin film layer in a first electrode region and a second electrode region being apart from each other on the first metal thin film layer; the third step is for forming a first electrode and the metal nanostructure which lies successively around the first electrode by annealing the second metal thin film layer formed in the first electrode region, and for forming a second electrode by annealing the second metal thin film layer formed in the second electrode region; and photo-induced current is generated between the first electrode and the second electrode respectively ohmic connected to sites of the conductive thin film layer whose distances from the metal nanostructure are different from each other, by light emitted to the metal nanostructure.

The method for manufacturing a thin film photoelectric conversion device according to claim 9 is characterized in that the substrate is a silicon substrate and the conductive thin film layer is composed of a metal silicide.

The method for manufacturing a thin film photoelectric conversion device according to claim 10 is characterized in that the first metal is any of Co, Fe, W, Ni, Al and Ti, and the second metal is any of Au, Ag, Pt, Cu and Pd.

Advantages

According to the invention of claim 1 and claim 7, photoelectric conversion of light having wide wavelength bands, from the visible range to the infrared range, can be performed in a manner independent on band gaps of materials of the substrate, such as silicon, at ordinary temperature without using harmful substances. Therefore, in the case where the thin film photoelectric conversion device is used as a light detecting sensor, its excellent sensitivity characteristic makes it possible to detect a wide range of light. Further, in the case where the thin film photoelectric conversion device is used as a solar cell, it is possible to perform photoelectric conversion of a wide range of sunlight to utilize it as electric power, and in particular when the sky is cloudy, it is possible to utilize, as electric power, about twice more solar energy than that utilized in the case of solar cells using p-n junction Si-based photoelectric conversion devices. Furthermore, by performing photoelectric conversion of infrared light scattered from the atmosphere after sunset, day/night power generation is expected. As the photoelectric conversion of the scattered infrared light is performed before the scattered infrared light is converted into heat, this is expected as a measure against global warning, as well.

The present invention is not for performing photoelectric conversion of light which transmits inside the substrate, but for performing photoelectric conversion at the surface of the substrate, and therefore, light loss is small and high sensitivity photo-induced current can be obtained.

Further, as photocarriers diffuse along the surface of the substrate, high speed photo-induced carriers with diffusion speed of about $10^7$ cm/s, which is comparable to the speed of compound semiconductors, are generated. Therefore, when used as a light detecting sensor, it is possible to realize a photoelectric conversion device which responds to an ultra-high speed image sensor, or to optical modulation waves in the GHz to THz band. As it is thin-film type, it is possible to use it as a surface-detecting CCD sensor which can be arrayed.

In addition, because majority carriers are generated at the interface of the barrier along the surface of the semiconductor substrate and the storage effect of minority carriers can be negligible, it becomes possible to reduce noise in comparison to pn junction optical sensors, and when it is used for solar cells, coexistence of p-type and n-type carriers is suppressed and there is no decrease in the conversion efficiency caused by recombination of them.

According to the invention of claim 7, in particular, the thin film photoelectric conversion device can be manufactured by a simple manufacturing process, only laminating the first metal thin film layer and the second metal thin film layer on the substrate and annealing the substrate, and it can be manufactured by just using very small amount of scarce elements in the manufacturing process.

According to the invention of claim 2, the periodic structure and the random structure, whose structures are different from each other, can be present in a mixed state in the same planar region by making differentiation between the heights of the second convex part and the first convex part from the substrate.

According to the invention of claim 3 and claim 8, generation of the photocarriers, high-efficiency generation of photocarriers caused by the enhancement of the photo-induced electric field and output of the photo-induced current by the generated photocarriers can be realized only on the surface of one device.

In addition, as the photo-induced current can be generated by only using the conductive thin film layer and the metal nanostructure on the surface of the substrate, the thickness can be reduced. When the thin film photoelectric conversion device is used for solar cells, it is possible to attach it to windows of buildings or automobiles, or housings for portable equipment such as mobile phones, and no restriction is applied to location to be attached.

Further, according to the invention of claim 4 and claim 8, the first electrode ohmic connected to the conductive thin film layer and the metal nanostructure can be formed by the process for forming the conductive thin film layer.

According to the invention of claim 5 and claim 9, the Si-based process for forming a metal silicide can be used. In addition, the metal silicide which forms the conductive thin film layer suppresses excessive diffusion of the second metal, which is an electrode-forming material, into the silicon substrate, and can prevent oxidation of silicon.

According to the invention of claim 6 and claim 10, the first metal and the second metal which is a noble metal can be manufactured from very small amount of scarce elements because both of them are used only for forming the metal thin film layers.

The first metal has a high melting point, is excellent in mechanical property at high temperature, and suitable as a material for the metal silicide. In particular, in the case where the first metal is Co, the metal silicide is CoSix used for an electrode underlayer of a silicon device, and an existing process can be used. Further, the second metal is chemically stable, hard to combine with silicon, and easy to form a metal nanostructure.

Figure 1:
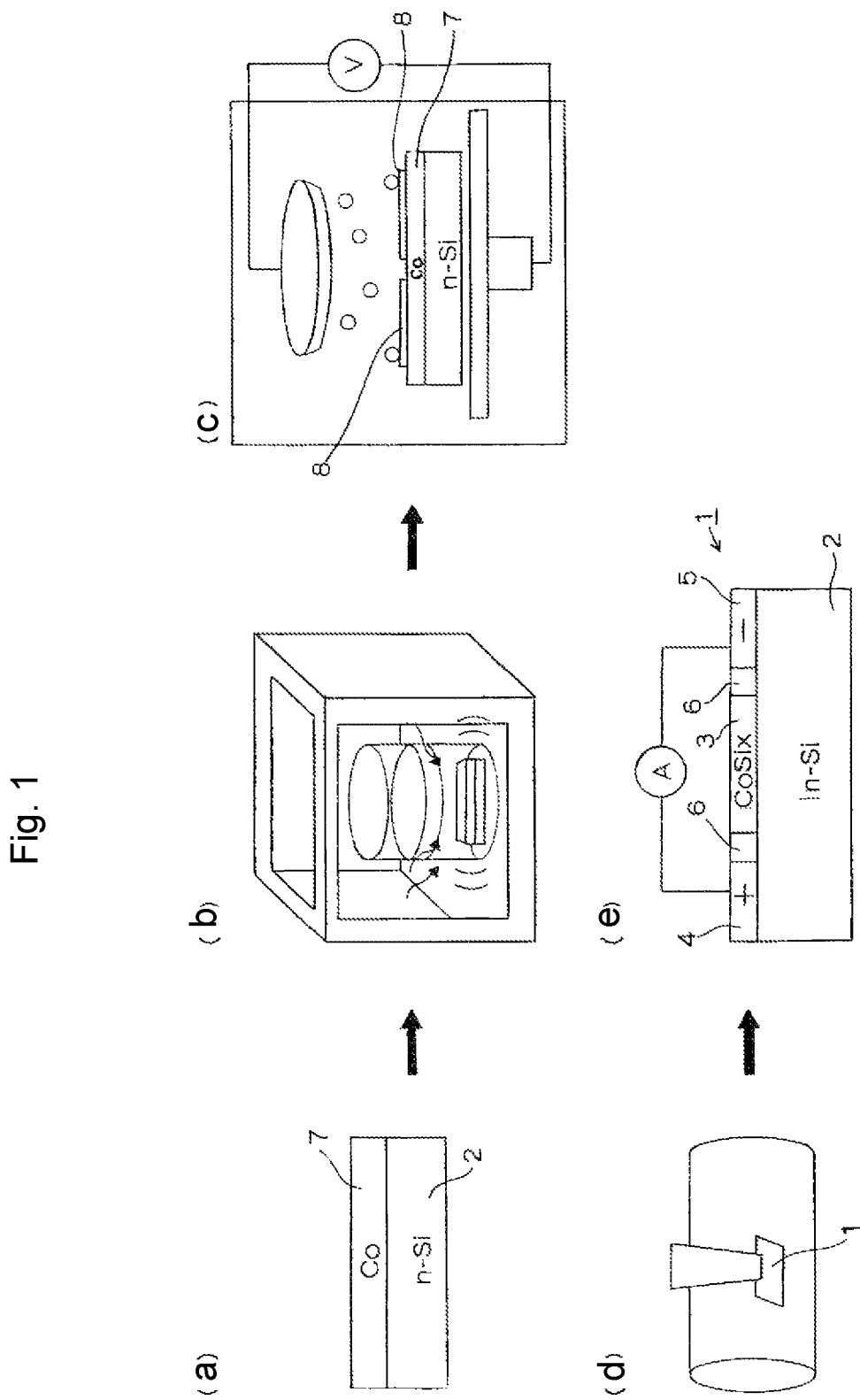
FIG. 1 is a process diagram showing a manufacturing process of the thin film photoelectric conversion device 1 according to an embodiment of the present invention.

REFERENCE NUMERALS 1, 20, 30 thin film photoelectric conversion device
n-Si substrate (semiconductor substrate)
3, 31 CoSix layer (metal silicide layer)
4, 41 anode electrode
5 cathode electrode
6 metal nanostructure

BEST MODES FOR CARRYING OUT THE INVENTION

The thin film photoelectric conversion device 1 according to an embodiment of the present invention will be described below with reference to FIG. 1 to FIG. 9. The thin film photoelectric conversion device 1 according to the present embodiment comprises, as shown in FIG. 1, an n-Si substrate 2 composed of n-type Si, which is a semiconductor substrate, a CoSix layer 3, which is a conductive thin film layer self-assembled on the surface of the n-Si substrate 2, a pair of an anode electrode 4 and a cathode electrode 5 ohmic connected to the CoSix layer 3, and a metal nanostructure 6, described later, formed successively on the CoSix layer 3.

The thin film photoelectric conversion device 1 having such a constitution is manufactured through the following steps as shown in FIG. 1, the process diagram showing a manufacturing process: a Co thin film 7 with a thickness of 8 nm is formed on the n-Si substrate 2 composed of n-type Si by sputtering (a); organic cleaning is performed for 5 minutes (b); then mask printing is performed and a Au thin film 8 is formed by sputtering, which has a sufficient thickness to form the anode electrode 4, the cathode electrode 5 and the metal nanostructure 6 at a predetermined distance from each other, in this case, at an interval of 9 mm, on the Co thin film 7 (c). Subsequently, the resultant is heated to 400 to 800° C., preferably to 600° C., with a heating-up time of 3 minutes, and annealing is performed at 600° C. for 5 minutes (d); and the thin film photoelectric conversion device 1 is manufactured (e).

By annealing the thin film photoelectric conversion device 1 manufactured through this process at about 600° C. for 3 minutes, laminated Si, Co and Au interdiffuse, the CoSix layer 3 self-assembled on the surface of the Si substrate 2 is formed, and the anode electrode 4 and the cathode electrode 5 ohmic connected to the CoSix layer 3 are formed from the Au thin film 8. At the same time, by the annealing, a Au-rich metal nanostructure 6, formed through diffusion of a part of the Au thin film 8 into the circumference of the anode electrode 4 and the cathode electrode 5, is formed. It has been confirmed that high sensitivity photo-induced current is generated between the anode electrode 4 and the cathode electrode 5, at the position of this metal nanostructure 6.

Figure 2:
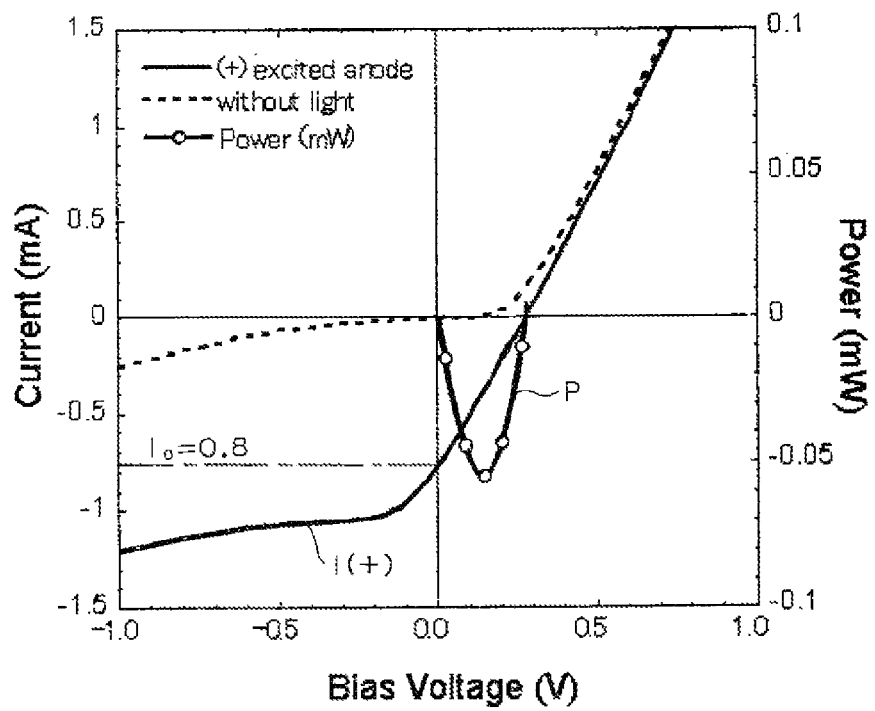
FIG. 2 is a waveform diagram showing the photo-induced current I (+) generated between the electrodes 4 and 5 when a laser light for excitation is emitted to the power generation region of the thin film photoelectric conversion device 1, and output.

In other words, though the details about the metal nanostructure 6 are described later, when a laser light for excitation, with a wavelength of 632 nm, output of 1.68 mW, and irradiation area of $0.4/mm^2$ was emitted to various positions on the surface of the thin film photoelectric conversion device 1, as shown in FIG. 2, high sensitivity photo-induced current I (+) was observed between the electrodes 4 and 5, at the irradiation position of this metal nanostructure 6, being about 1 mm apart from the circumference of the anode electrode 4. As this photo-induced current I (+) was 0.8 mA at $I_0$, zero-bias, and the output of the laser light was 1.68 mW, an ultra high sensitivity output of 470 mA/W in a visible light range of 632 nm was obtained at the experimental stage in which optimization of the process or the structure was not performed.

The generated electricity, shown by P in the figure, was 0.06 mW, and the output and the irradiation area of the laser light were 1.68 mW and $0.4/mm^2$, respectively. Based on these, the photoelectric conversion efficiency (A) per unit area ($mm^2$) was 0.15 mW/1.68 mW, that is, 8.9%. Further, power generation area ratio (B), which is a ratio of the area of the power generation region in which the photo-induced current is generated, that is, 22 $mm^2$, to the entire surface area of the photoelectric conversion device 1, that is, 256 $mm^2$, was 8.6%. Power generation capacity (C) with sunlight of AM 1.5 Air Mass in the visible range was 6.45 $W/m^2$, calculated by multiplying solar energy 844 $W/m^2$ (AM 1.5 Air Mass in the visible range), the photoelectric conversion efficiency (A) and the power generation area ratio (B) together. The above results show that it is sufficiently possible to apply the photoelectric conversion device 1 to solar cells even in the case where only sunlight in the visible range is used.

Figure 3:
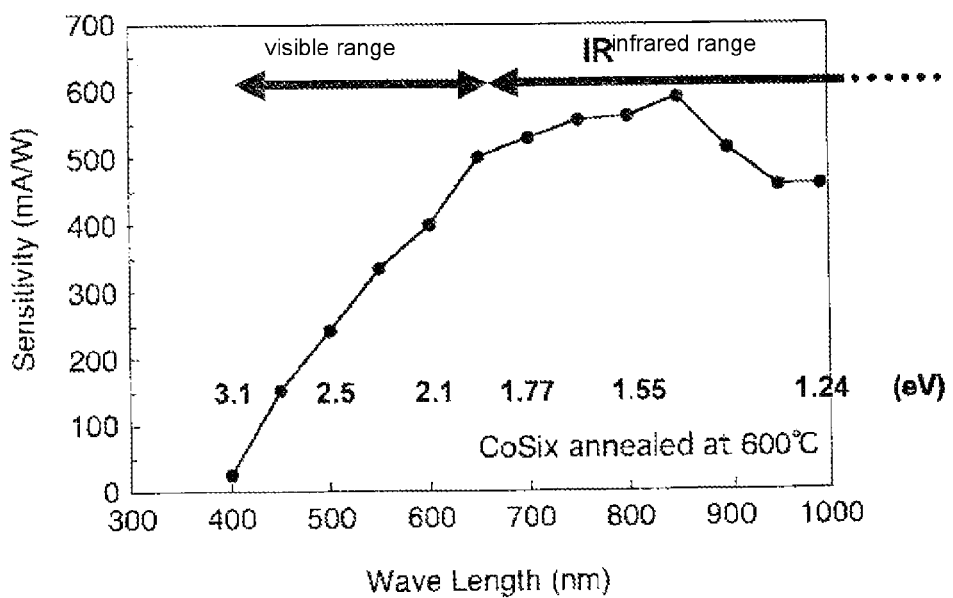
FIG. 3 is a waveform diagram showing the relationship between the wavelength of the laser light for excitation and the sensitivity of the thin film photoelectric conversion device 1.
Figure 4:
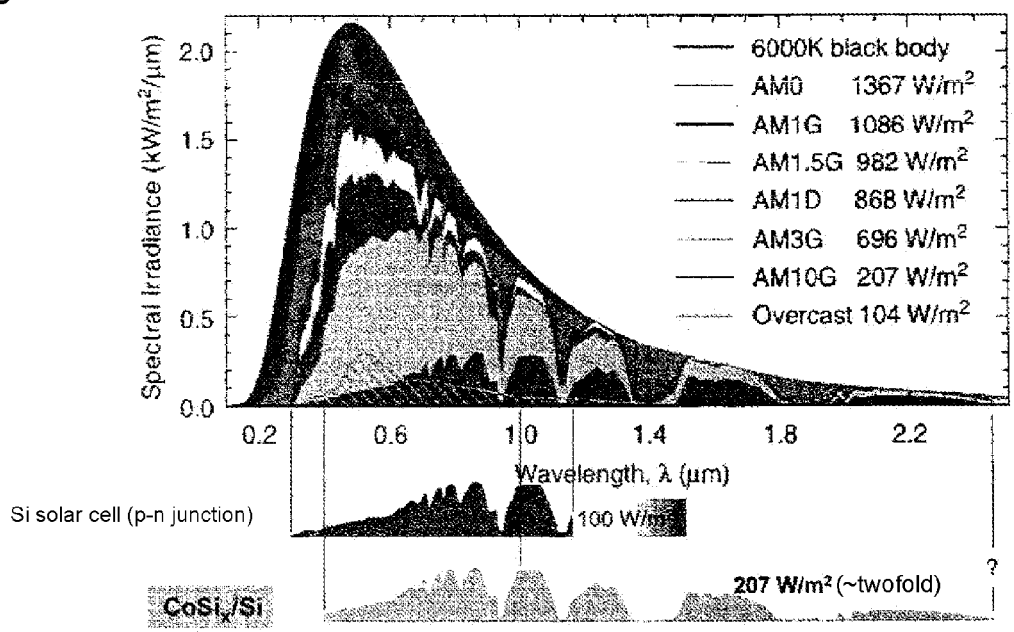
FIG. 4 is a graph showing the emission characteristic of sunlight.

FIG. 3 is a graph showing the sensitivity (mA/W) observed between the electrodes 4 and 5 when the wavelength of the laser light for excitation, the power generation region being irradiated with the laser light at ordinary temperature, was altered from the visible light range to the infrared range. In the figure, it is shown that the thin film photoelectric conversion device 1 performs photoelectric conversion of light having wavelengths of from 0.4 μm to 1 μm. However, in addition to that, it is confirmed that the thin film photoelectric conversion device 1 performs photoelectric conversion of infrared light having wavelengths up to at least 2 μm with high sensitivity.

As described above, the power generation capacity estimated from the photoelectric conversion efficiency (A) of 8.9% and the power generation area ratio (B) of 8.6% was 6.45 W/m² (AM 1.5 Air Mass in the visible range). However, as Si-based solar cells in general perform photoelectric conversion at a p-n junction, such cells cannot be used for the infrared range of wavelengths equal to or longer than 1.2 μm, wherein the radiation energy is equal to or smaller than the energy gap, and therefore, the power generation capacity depends on the emission characteristic of sunlight (Solar Energy Material & Solar Cells 90 (2006) 2329) shown in FIG. 4. As shown in the figure, in cloudy weather (AM 10G), a ratio of solar energy in the infrared range is high, and in the case of p-n junction Si-based solar cells whose availability for use is limited to light having wavelengths equal to or shorter than 1.2 μm, available solar energy is up to 100 W/m². On the other hand, in the case of the photoelectric conversion device 1 according to present embodiment which can perform photoelectric conversion of light having wavelengths ranging from the visible range to the infrared range, solar energy of 207 W/m², about twice more solar energy than that in the case of p-n junction Si-based solar cells, can be utilized.

Figure 5:
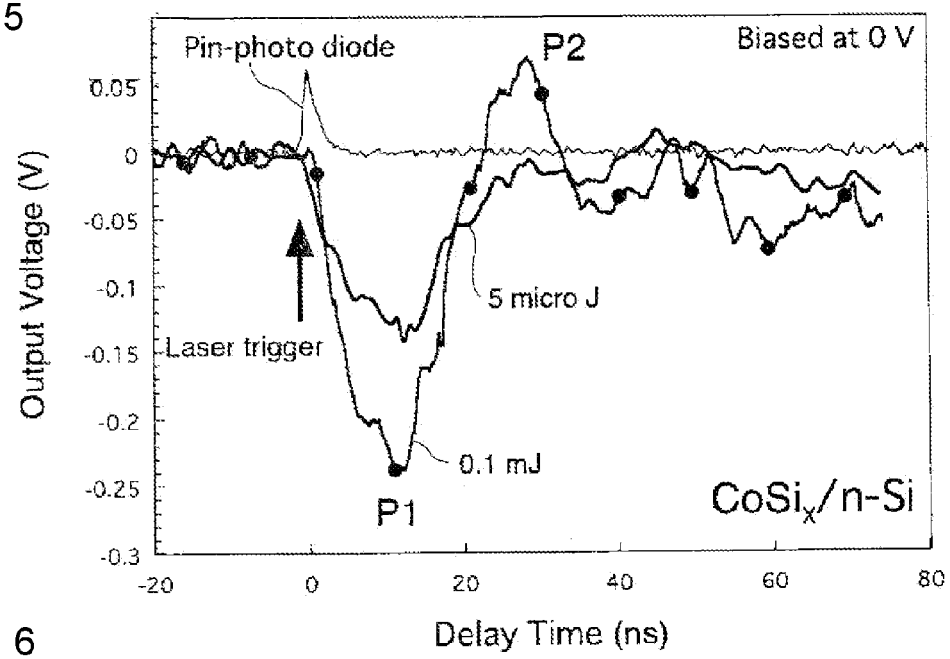
FIG. 5 is a waveform diagram comparing the response performance of the thin film photoelectric conversion device 1 with that of the Pin-photo-diode.

In addition, photo-induced carriers generated on the photoelectric conversion device 1 diffuse at a high speed comparable to the speed of compound semiconductors. FIG. 5 is a waveform diagram comparing the response performance of a Pin-photo-diode (hereinafter referred to as Pin-diode) and the thin film photoelectric conversion device 1, upon the irradiation of the power generation region of the metal nanostructure 6 with laser light, the power generation region of the metal nanostructure 6 being about 1 mm apart from the circumference of the anode electrode 4. In the experiment shown in the figure, two kinds of laser light having different laser powers (0.1 mJ and 5 microJ) were also emitted to compare the response performances. In the figure, the vertical axis represents voltage between the anode electrode 4 and the cathode electrode 5 at zero-bias, and the waveform for the thin film photoelectric conversion device 1 in the figure shows changes in negative photovoltaic power caused after photo-induced carriers, generated in the power generation region by emission of the laser light, had reached the anode electrode 4.

As shown in the figure, as to the thin film photoelectric conversion device 1, the distance between the irradiation position and the anode electrode 4 where responses were detected was about 1 mm, and was longer than that of a Pin-diode. However, regardless of the powers of the emitted laser light, the thin film photoelectric conversion device 1 showed a falling response within 2 to 3 ns, about the same falling response time as that of a Pin-diode, after irradiation (denoted as "Laser trigger" in the figure).

Further, assuming that the photo-induced carriers generated at the interface of the surface of the n-Si substrate 2, that is, the irradiation position, reach the anode electrode 4 about 10 ns after irradiation, the diffusion speed of the photo-induced carriers is about $10^7$ cm/s, and this speed is close to the speed of thermal electrons at ordinary temperature ($1.2 \Box 10^7$ cm/s).

Response characteristics obtained by two kinds of laser powers were compared. When more powerful laser light (0.1 mJ) was emitted, negative photovoltaic power at P1 was −0.25 V. This value was obviously greater than that obtained when the laser light (5 microJ) was emitted, however, reverse polarity photovoltaic power was subsequently generated in the vicinity of P2. It is assumed that this is because the photo-induced carriers generated from inside the n-Si substrate 2 move around within the substrate 2 and reach the cathode 5 later than the photo-induced carriers generated on the surface of the n-Si substrate 2. In the case where the laser power was lowered to 5 microJ, there was less impact on the inside of the n-Si substrate 2, and a peculiar peak, such as that observed in the vicinity of P2, was not observed.

As just described, high speed photo-induced carriers whose speed is comparable to that of compound semiconductors are generated in the thin film photoelectric conversion device 1 according to the present embodiment. Therefore, the thin film photoelectric conversion device 1 can respond to ultra-high speed image sensors or optical modulation waves caused by pulse laser excitation, and can be used for optical sensors of the GHz to THz band.

A conventional Schottky model such as an M-S structure composed of Si and CoSix cannot explain the above-described high speed transferability, high sensitivity characteristic and broadband characteristic. It is thought that while Au and Co interdiffuse on the substrate 2 along the surface of the substrate upon annealing, an M-I-M structure in which an insulator such as a carbon compound is interposed is formed, and the photo-induced carriers are generated from the interface at which an energy gap is created.

Figure 6:
FIG. 6 is an SEM image obtained by observation with an SEM of the metal nanostructure 6 composed of metal fractal structures.

Therefore, attention was focused on the following facts: in the region where the Au thin film 8 was laminated onto the Co thin film 7 and then annealing was performed, the photovoltaic power was not generated at the position of the anode electrode 4 itself where the Au thin film 8 was left, or at the position apart from the anode electrode 4, where the CoSix layer 3 was exposed; and the maximum photovoltaic power was generated at the position about 1 mm apart from the circumference of the anode electrode 4. When the structure was observed with an SEM (scanning electron microscope), a Au-rich metal nanostructure 6 as shown in FIG. 6 was observed, which was formed by interdiffusion of the Au thin film 8 and Co and Si into the circumference of the anode electrode 4 whose height is equal to or more than 100 nm, when the Au thin film 8 on the Co thin film 7 was annealed in order to form the anode electrode 4. It was found that the above-described high speed transferability, high sensitivity characteristic and broadband characteristic, which are unique to the thin film photoelectric conversion device 1, can be obtained through the metal nanostructure 6, shown in FIG. 7. The metal nanostructure 6 has the following structure: the periodic structure 11, wherein a number of first convex parts 11*a* successively lie with a pitch of from one-tenth of a wavelength of an incident light to equal to or shorter than the wavelength of the incident light in a planar direction along the substrate 2, is formed on the substrate 2; and the random structure 12, wherein a distance between any pair of a number of second convex parts 12*a* formed at random positions on the substrate 2, or a distance between a second convex part 12*a* and a first convex part 11*a* is shorter than 100 nm, is formed on the substrate 2 in a position within a region of the periodic structure 11 or in a position adjacent to the periodic structure 11.

Conventionally, with regard to the metal nanostructure in which a periodic structure is formed on the surface of substances having different conductivities, refractive indexes, permittivities or the like, wherein concavities and convexities successively lie with a pitch of from one-tenth of a wavelength of an incident light to a wavelength equal to that of the incident light, it has been supported theoretically and experimentally that the electric field of light is enhanced by plasmon resonance on the surface of the metal nanostructure. For example, it has been reported that when there is a periodic structure of metal clusters composed of a population or the like of fine particles or rods on a flat surface of an insulator substrate, the photo-induced electric field is enhanced in the region of metal particles by several orders of magnitude. A similar phenomenon has also been observed in metal fractal structures in which metal fine particles are assembled in a fractal form.

In the above-described power generation region observed with the SEM, a metal nanostructure 6 in which metal clusters in the form of fibers, dendrites, dots or the like successively lie with submicron scale periodicity, or a metal nanostructure 6 composed of metal fractal structures is present on the n-Si substrate 2. Due to the formation of a number of metal clusters or metal fractal structures on the substrate, an M-I-M structure is formed along the plane of the substrate. An energy gap is present in the structure and a photo-induced electric field is generated in a planar direction upon receiving light.

Figure 7:
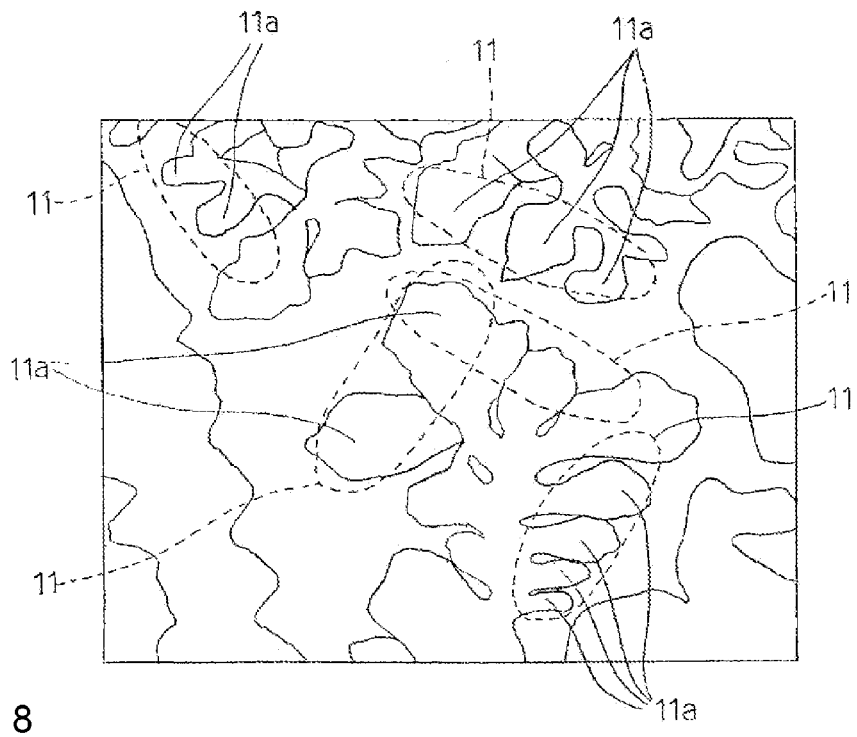
FIG. 7 is a pattern diagram explaining the SEM image of FIG. 6.

In the metal nanostructure 6 composed of metal fractal structures shown in FIG. 6, a number of periodic structures 11 are observed as shown in FIG. 7 in which the first convex parts 11a successively lie with a pitch in the submicrometer to several micrometer range. The wavelength of light for which the photo-induced electric field is enhanced by surface plasmon resonance depends on the pitch and the aspect ratio of the periodic structure 11. The width of the region in each periodic structure 11 is equal to or smaller than several micrometers, and in the metal nanostructure 6, there are many kinds of periodic structure 11 wherein the first convex parts 11a successively lie with a pitch of from one-tenth to about the same wavelength as that of light having wavelengths of from 0.4 µm to 2 µm, which is confirmed to be photoelectrically converted by the above-described thin film photoelectric conversion device 1. Therefore, it is thought that for every incident light with different wavelengths, surface plasmon resonance occurs in the periodic structure 11 with a pitch which satisfies the requirements for the occurrence of surface plasmon resonance, and as a result, there are responses to a wide range of incident light, from the visible range to the infrared range of equal to or longer than 1 µm.

In addition, in the metal nanostructure 6 shown in FIG. 6, a number of the second convex parts 12a are formed at random positions extraneous to the pitch of the periodic structure 11. As described in K. Kobayashi, et al., Progress in Nano-Electro-Optecs I. ed. M. Ohtsu, p. 119 (Sptinger-Verlag, Berlin, 2003), near field interaction is known in which an electric field is concentrated in a space between convex parts tens of nanometers in size, and enhanced. Also in the metal nanostructure 6 shown in FIG. 6, a random structure, wherein a distance between the second convex parts 12a or between the second convex part 12a and the first convex part 11a is shorter than 100 nm, is present in a position within a region of the periodic structure 11 or in a position adjacent to the region. As a result, in the region where this random structure is present, the photo-induced electric field enhanced by the plasmon resonance is concentrated in the space between the convex parts 11a and 12a in the random structure, and the photo-induced electric field is further enhanced by the synergistic effect of the plasmon resonance and the near field interaction. It is assumed that the plasmon resonance phenomenon occurs in a periodic structure whose scale is from one-tenth to about the same wavelength as that of the incident light. The near field interaction occurs to the extent that both the distance between the convex parts along the substrate 2 and the height of the convex parts from the substrate 2 are equal to or smaller than tens of nanometers, and the height of the metal nanostructure 6 in which the plasmon resonance and the near field interaction occur is equal to or smaller than tens of nanometers, which is a height which allows near field interaction to occur.

Likewise, in each periodic structure with a pitch which satisfies the requirements for the occurrence of the plasmon resonance, the photo-induced electric field is enhanced by the synergistic effect of the plasmon resonance and the near field interaction, and accordingly, a wavelength band of light which causes the enhancement of the photo-induced electric field is broad.

Further, as the photo-induced electric field is enhanced for incident light of each wavelength, carriers respond even to weak light, detection sensitivity increases, and the photovoltaic power is enhanced.

Furthermore, as the M-I-M structure is formed along the plane of the substrate, it is assumed that the electric field of light enhanced by the synergistic effect of the plasmon resonance and the near field interaction lies in a direction along the surface of the substrate, that the photo-induced carriers are accelerated by the electric field of light, and that the photo-induced carriers transfer across the surface of the substrate at a high speed of about $10^7$ cm/s, which is close to the speed of free electrons at ordinary temperature.

As the metal nanostructure 6 of the thin film photoelectric conversion device 1 according to the present embodiment does not comprise simple alignment of metal fine particles but comprise the periodic structure 11 and the random structure being present in a mixed state, the plasmon resonance can be caused in a wide range of wavelength bands, and photoresponse sensitivity can be increased. However, the wavelength band characteristic and the sensitivity of the thin film photoelectric conversion device 1 are thought to be affected by the periodic structure 11 or the random structure 12 of the metal nanostructure 6, or selection of metal materials for Co thin film 7, Au thin film 8 and the like which forms the structures, their thicknesses, particle sizes, and condensation states of metal fine particles generated in the course of processing. By making various modifications to these factors without constrained to the above-described embodiment, a thin film photoelectric conversion device having better broadband characteristic and high sensitivity characteristic can be expected to be obtained.

The photoresponse sensitivity is thought to be dependent on heating temperature (annealing temperature) and heating time including heating-up time of annealing, which is a requirement for forming the metal nanostructure 6, and photo-induced currents generated by the thin film photoelectric conversion device 1 manufactured through various annealing temperatures were compared in order to obtain an optimum annealing process.

Figure 8:
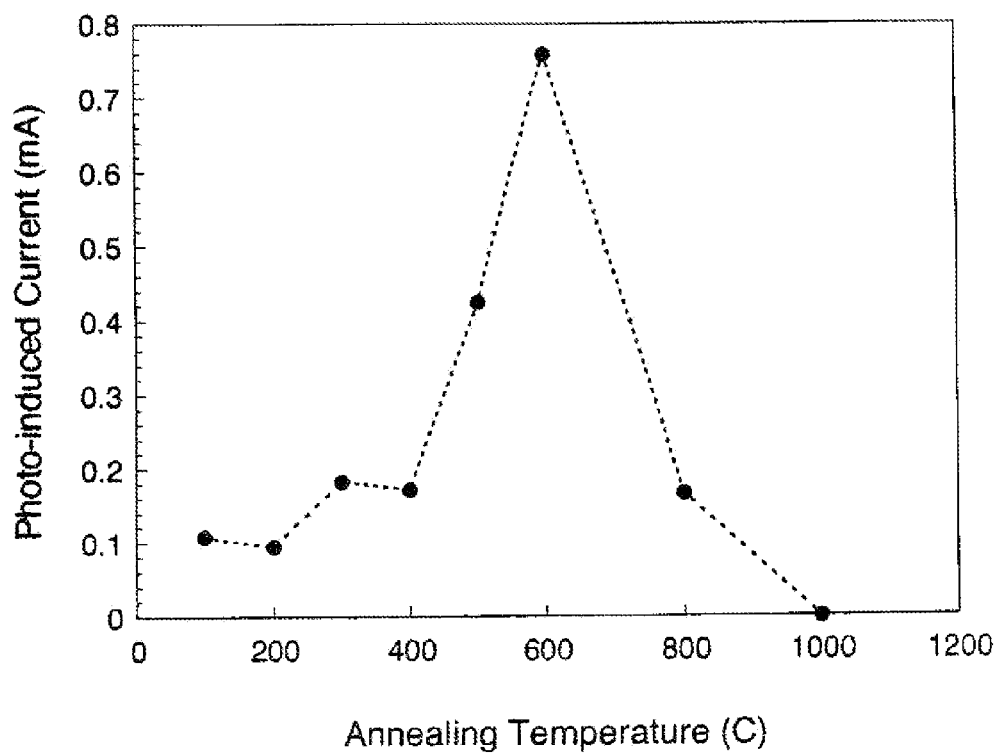
FIG. 8 is a graph showing the relationship between the annealing temperature and the photo-induced current generated from the thin film photoelectric conversion device 1 which has been annealed at the temperature.
Figure 9:
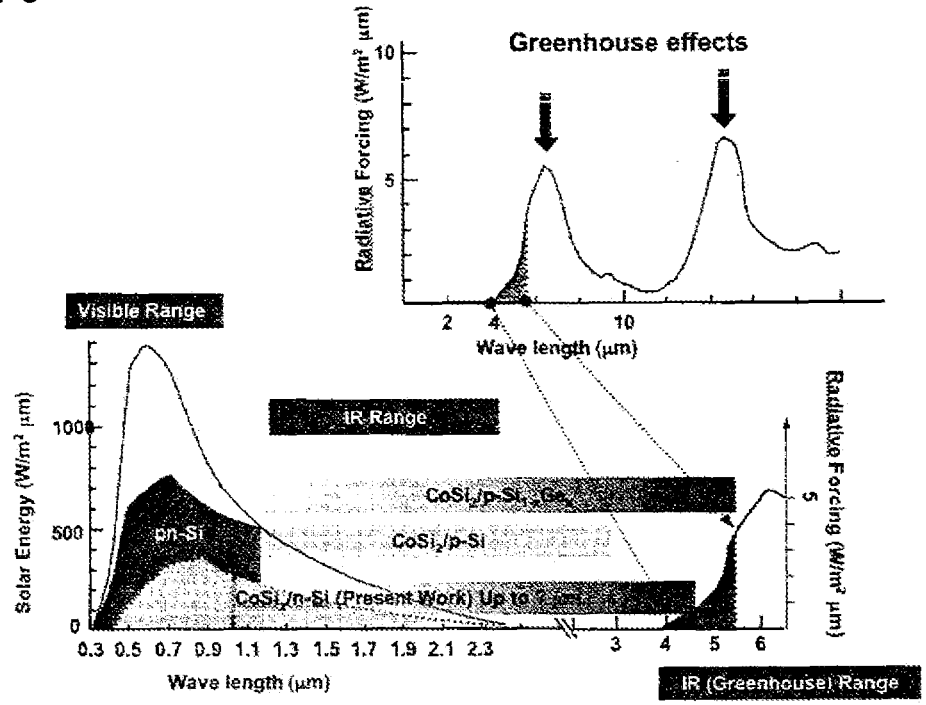
FIG. 9 is an explanatory diagram showing the relationship between spectral emission characteristic of Greenhouse Effects and a photoelectric conversion device for performing photoelectric conversion of light having wavelengths of from about 5 to 6 μm.

FIG. 8 is a graph showing the results of this experiment. As shown in the figure, the greatest photo-induced current was obtained from the metal nanostructure 6 of the thin film photoelectric conversion device 1 which had been annealed at an annealing temperature of 600° C. Further, based on the results from the experiment in which preheating time or heating time was altered, the greatest photo-induced current was obtained when annealing was performed with a heating-up time of 3 minutes and a heating time of 5 minutes at 600° C. The heating-up time and the heating time are much shorter than those used in ordinary annealing processes for forming Au electrodes on Si substrates. This is thought to be due to the following facts: when heating-up time and heating time longer than those described above are used, the metal nanostructure 6 having the above-described constitution is not formed because interdiffusion among Au, Co, and Si proceeds to form an alloy; and when heating-up time and heating time shorter than those described above are used, the Au-rich metal nanostructure 6 is not formed because Au does not diffuse.

In addition, as described above, the photoelectric conversion device 1 which responds to light having wavelengths in a range from the visible range to the infrared range (verified for 0.4 to 2 μm) has not been known. At least, in a schottky type photoelectric conversion device, there is limitation to a certain wavelength band because a long-wavelength side is restricted by a barrier, an energy gap, and a short-wavelength side is restricted by density of states of carriers (carriers are not allowed to exist). However, from the metal nanostructure 6 wherein the periodic structure 11 and the random structure are present in a mixed state, it is possible to obtain a broadband characteristic which can never been obtained at least from the Schottky type one. Therefore, it is expected to obtain a broader wavelength band characteristic, up to about 5 to 6 μm as described above, by making various selections for pitches of the periodic structure 11, combination of the random structures, or metal materials thereof.

According to the spectral emission characteristics of Greenhouse Effects (E. E. Bell, et al., J. Opt. Soc. Am., 50 (1950) 1313-1320) shown in FIG. 9, in particular, infrared light having wavelengths equal to or longer than 4 μm is scattered from the atmosphere after sunset. By using the photoelectric conversion device 1 for performing photoelectric conversion of light having wavelengths up to about 5 to 6 μm for solar cells, it is expected that photoelectric conversion of infrared light having wavelengths equal to or longer than 4 μm is performed to obtain electric power before the infrared light is converted to thermal energy, it becomes possible to take measures against global warming through atmospheric cooling, and conversion to electric power can be performed with higher power generation capacity by day/night continuous power generation.

Further, as the thin film photoelectric conversion device 1 according to the present embodiment performs photoelectric conversion only on the surface of the n-Si substrate 2, it is also possible to reduce the thickness of the entire device and attach it to walls of buildings or on the surface of cases of portable equipment to generate power, and no restriction is applied to location to be attached. Furthermore, when the substrate 2 is an Si substrate as is the case with the present embodiment, a photoelectric conversion device used for solar cells or image sensors can be manufactured by using a simple Si-based process.

In addition, the Co thin film 7 formed on the n-Si substrate 2 which forms CoSix layer 3 may be a thin film metal layer of, for example, Fe, W, Ni, Al, Ti or the like, and the Au thin film further laminated on the thin film metal layer does not have to be Au, and the thin film layer can be formed with other noble metals such as Ag, Pt, Cu and Pd.

Further, a pair of the anode electrode 4 and the cathode electrode 5 for generating photovoltaic power may be connected, for example by using a conductive adhesive, to the site where the metal nanostructure 6 is formed with the same material as that of the electrodes or other conductive materials, after the metal nanostructure 6 is formed. Furthermore, the connecting position does not have to be the surface of the substrate 2 where a metal silicide layer is formed, and one of the electrodes can be formed in other positions, for example on the backside of the semiconductor substrate in the case where there is no need to apply the induced current to the surface.

Example 1

A Co thin film with a thickness of 8 nm was formed by sputtering on the entire surface of an n-Si substrate composed of n-type Si having a roughly square shape, and organic cleaning was performed for 5 minutes, then mask printing was performed and a Au thin film with a thickness of about 10 nm was formed on four corners and center of the surface of the square Co thin film by sputtering. Subsequently, annealing was performed under the condition of heating-up time of 1 minute, annealing temperature of 600° C., annealing time of 3 minutes to obtain the thin film photoelectric conversion device 30 in which each of the following components was formed: a CoSix layer 31 with a thickness equal to or smaller than 10 nm, which is a conductive thin film layer self-assembled on the surface of the n-Si substrate; a cathode electrode ohmic connected to the CoSix layer 31 on the four corners of the substrate; an anode electrode 41 ohmic connected to the CoSix layer 31 in the center of the substrate; and a metal nanostructure 32 which lie continuously with the CoSix layer 31 at each circumference of the cathode electrode and the anode electrode 41.

Figure 10:
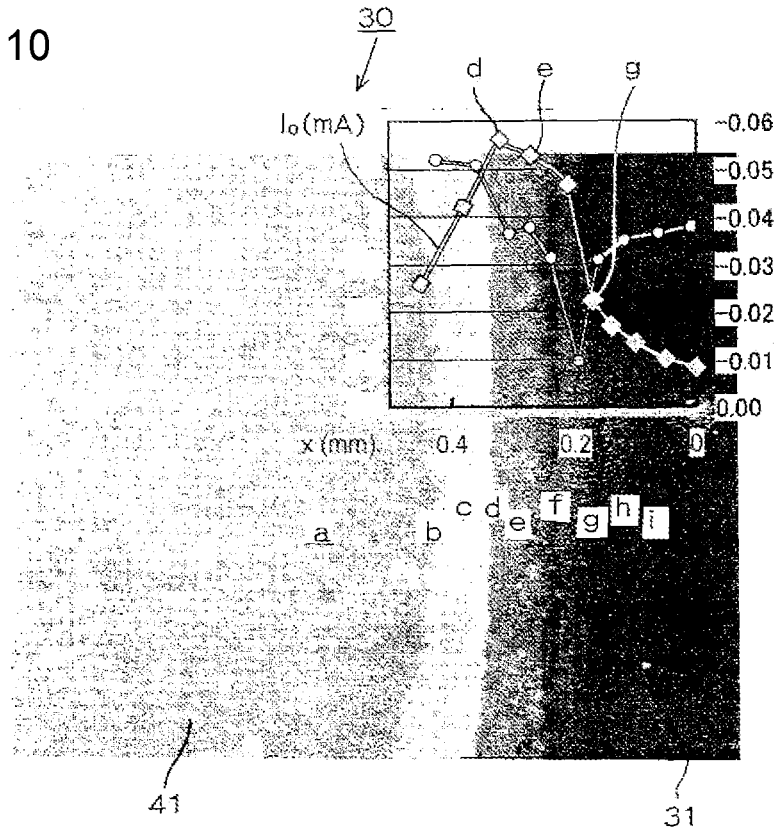
FIG. 10 is an explanatory diagram showing the relationship between the position of the thin film photoelectric conversion device 30 according to the second example emitted by the laser light for excitation and the photo-induced current $I_0$ at the irradiation position.

Following this, in a boundary region of the anode electrode 41 and the CoSix layer 31 of the thin film photoelectric conversion device 30, as shown in FIG. 10, a laser light for excitation (laser power was 0.2 mW, irradiation area was 10 mm², and the wavelength of the laser light was 635 nm) was emitted to 9 positions which lies in the roughly straight line from the position "a" on the anode electrode 41 side to the position "i" where the CoSix layer 31 was exposed, and the photo-induced current $I_0$ flowing between the anode electrode 41 and the cathode electrode at zero-bias was measured. As a result, the photo-induced current $I_0$ equal to or greater than 0.05 mA was detected at the positions "d" and "e" around which a part of the Au thin film which forms the anode electrode 41 appeared to diffuse, and structures of these positions "d" and "e", and of a position "g" in which rapid decrease of the photo-induced current $I_0$ was observed were analyzed with an AFM (atomic force microscope).

Figure 11:
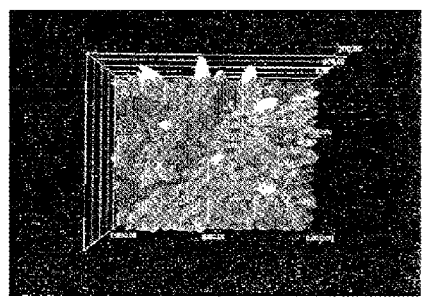
FIG. 11 is a three-dimensional image obtained by analyzing the irradiation position "d" of FIG. 10 with an AFM.
Figure 12:
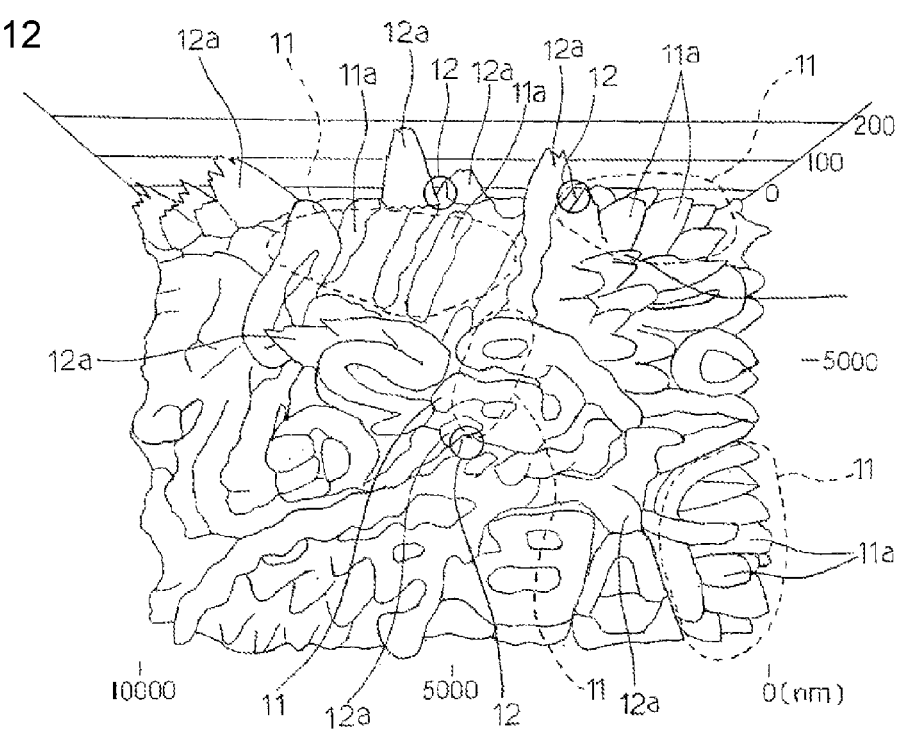
FIG. 12 is a pattern diagram explaining the three-dimensional image of FIG. 11.

FIG. 11 is a three-dimensional image of a region of 7.5 μm in height by 10 μm in width obtained by analyzing the position "d" with the AFM. Based on this three-dimensional image and an analysis result that surface roughness Ra according to JIS B0601 is 16.3 nm, the following structures which have a surface roughness Ra of 16.3 nm are observed as shown in FIG. 12: many kinds of periodic structures 11 wherein a number of the first convex parts 11a with a height of 10 to 20 nm successively lie with submicron scale periodicity in a planar direction; and the random structure 12 wherein a number of the second convex parts 12a with a height of 50 to 200 nm are formed at random positions so that a distance between the second convex parts 12a or between the second convex part 12a and the first convex part 11a is shorter than 100 nm. The metal nanostructure 6, wherein the random structure 12 is formed in a position within a region of each periodic structure 11 or in a position adjacent to the region of the periodic structure 11, is formed in the position "d". Therefore, in the metal nanostructure 6 formed in the position "d", the heights from the substrate 2 are different between the first convex part 11a and the second convex part 12a, and consequently the periodic structure 11 and the random structure 12 are present in a mixed state in the same planar region of the substrate 2.

Figure 13:
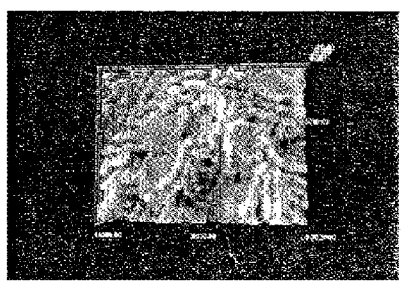
FIG. 13 is a three-dimensional image obtained by observing the irradiation position "e" of FIG. 10 with the AFM.
Figure 14:
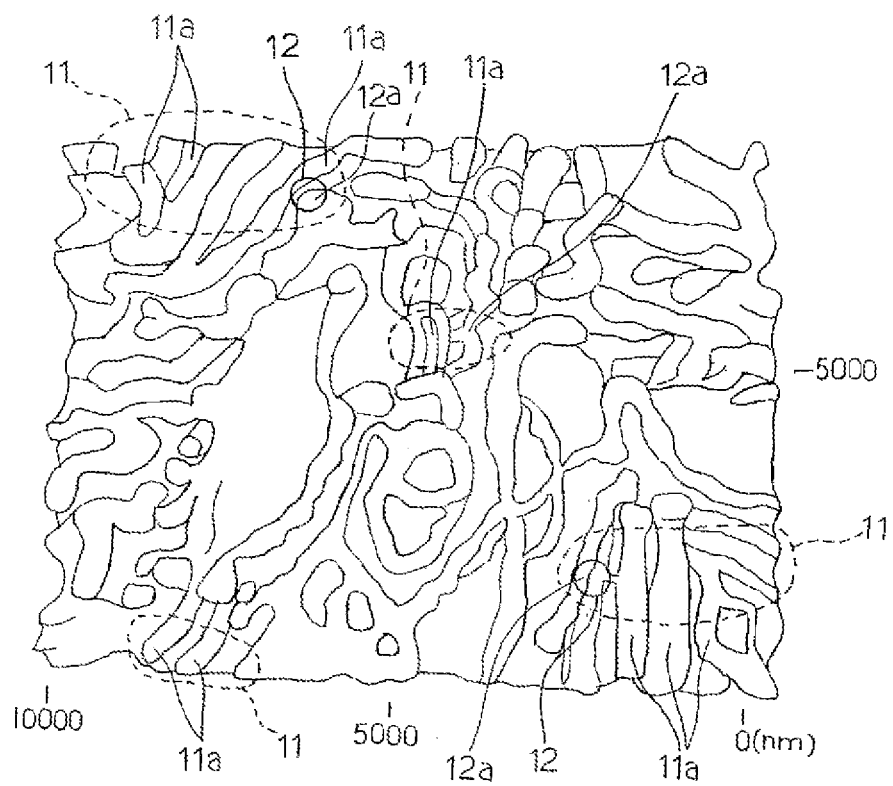
FIG. 14 is a pattern diagram explaining the three-dimensional image of FIG. 13.
Figure 15:
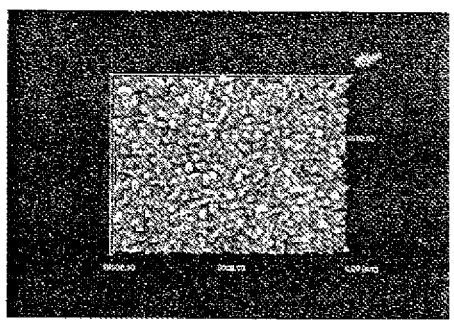
FIG. 15 is a three-dimensional image obtained by observing the irradiation position "g" of FIG. 10 with the AFM.

Further, FIG. 13 is a three-dimensional image of a region of 7.5 μm in height by 10 μm in width obtained by analyzing the position "e" with the AFM, and a number of fibrous clusters are seen. In comparison to the metal nanostructure 6 in the position "d", the region of the periodic structure 11 is a little deformed and reduced, however, based on this three-dimensional image and an analysis result that surface roughness Ra according to JIS B0601 is 10.7 nm, the following concavities and convexities which have a surface roughness Ra of 10.7 nm are observed as shown in FIG. 14: many kinds of periodic structures 11 wherein the dendritic first convex parts 11*a* with a height of 10 to 20 nm, composed of a number of fibrous clusters, successively lie with submicron scale periodicity in a planar direction; and the random structure 12 wherein a number of the dendritic second convex parts 12*a* slightly higher than the first convex part 11*a* are formed at random positions so that a distance between the second convex parts 12*a* or between the second convex part 12*a* and the first convex part 11*a* is shorter than 100 nm. The metal nanostructure 6, wherein the random structure 12 is formed in a position within a region of each periodic structure 11 or in a position adjacent to the region of the periodic structure 11, is formed in the position "e".

Based on the fact that the high sensitivity photo-induced current $I_0$ was detected at the position "d" and the position "e" as just described, it is confirmed that plasmon resonance phenomenon occurs in these positions "d" and "e", even in the periodic structure 11 whose aspect ratio shows that the distance between the first convex parts 11*a* in a planar direction is several dozen times greater than the height from the substrate 2, that the photo-induced electric field is enhanced by the synergistic effect of the plasmon resonance and the near field interaction in which the enhanced photo-induced electric field is concentrated in the random structure 12 within a region of the periodic structure 11 or adjacent to the region, and that high sensitivity photo-induced current $I_0$ is generated.

On the other hand, with regard to the position "g" in which photo-induced current $I_0$ was decreased, as shown in the three-dimensional image of FIG. 14 obtained by analyzing a region of 7.5 μm in height by 10 μm in width in the position "g" with the AFM, there observed a periodic structure 11 which has a surface roughness Ra according to JIS B0601 of 7.5 nm, and is composed of granular clusters in which heights thereof and average distances therebetween is nearly uniform. However, as the periodic structure 11 present in the region of the position "g" had a pitch in which the distances between the convex parts are uniform, there present no periodic structure 11 which satisfies the requirement for the occurrence of the plasmon resonance phenomenon by an incident light having a wavelength of 635 nm. Further, random convex parts which correspond to the second convex parts 12*a* apart from the periodic structure 11 were not confirmed, and the near field interaction did not occur. These are possible reasons for the decrease in the photo-induced current.

INDUSTRIAL APPLICABILITY

The present invention is suitable for photoelectric conversion devices used for solar cells or high speed optical sensors.

The invention claimed is:

1. A thin film photoelectric conversion device comprising a metal nanostructure composed of a number of metal clusters or metal fractal structures formed on a substrate, wherein:
   the metal nanostructure has the following structure: a periodic structure, wherein a number of first convex parts successively lie with a pitch of from one-tenth of a wavelength of an incident light to a wavelength equal to or shorter than the wavelength of the incident light in a planar direction along the substrate, is formed on the substrate; and a random structure, wherein a distance between any pair of a number of second convex parts formed at random positions on the substrate, or a distance between a second convex part and a first convex part is shorter than 100 nm, is formed on the substrate in a position within a region of the periodic structure, and wherein photo-induced current is generated by an incident light emitted to the metal nanostructure.

2. The thin film photoelectric conversion device according to claim 1, wherein a height of the second convex part on the substrate is higher than that of the first convex part.

3. The thin film photoelectric conversion device according to claim 2, which further comprises: a conductive thin film layer formed on the substrate continuously with a metal nanostructure and a first electrode and a second electrode respectively ohmic connected to sites of the conductive thin film layer whose distances from the metal nanostructure are different from each other; and wherein: photo-induced current is generated between the first electrode and the second electrode by an incident light emitted to the metal nanostructure.

4. The thin film photoelectric conversion device according to claim 3, wherein;
   the conductive thin film layer is formed on the substrate from a first metal by annealing the substrate on which a first metal thin film layer composed of the first metal and a second metal thin film layer composed of a second metal which is partially overlapped onto the first metal thin film layer are laminated; and the metal nanostructure is formed continuously with the conductive thin film layer by interdiffusion, which occurs at the annealing, of the first metal and the second metal at the circumference of the second metal thin film layer which forms the first electrode.

5. The thin film photoelectric conversion device according to claim 3 or claim 4, wherein the substrate is a silicon substrate and the conductive thin film layer is composed of a metal silicide.

6. The thin film photoelectric conversion device according to claim 5, wherein a first metal is any of Co, Fe, W, Ni, Al and Ti, and a second metal is any of Au, Ag, Pt, Cu and Pd.

7. A method for manufacturing a thin film photoelectric conversion device which comprises:
   a first step for forming a first metal thin film layer composed of a first metal on a substrate, a second step for forming a second metal thin film layer composed of a second metal on a part of the first metal thin film layer, and a third step for forming a conductive thin film layer formed from the first metal on the substrate and a second metal-rich metal nanostructure on the conductive thin film layer by annealing the first metal thin film layer and the second metal thin film layer laminated on the substrate; and wherein:
   the metal nanostructure formed by the third step is constituted by a number of metal clusters or metal fractal structures, and the metal nanostructure has the following structure: a periodic structure, wherein a number of first convex parts successively lie with a pitch of from one-tenth of a wavelength of an incident light to a wavelength equal to or shorter than the wavelength of the incident light in a planar direction along the substrate, is formed on the substrate; and a random structure, wherein a distance between any pair of a number of second convex parts formed at random positions on the substrate, or a distance between a second convex part and a first convex part is shorter than 100 nm, is formed on the substrate in a position within a region of the periodic structure or in a position adjacent to the region of the periodic structure.

8. The method for manufacturing a thin film photoelectric conversion device according to claim 7, wherein the second step is for forming the second metal thin film layer in a first electrode region and a second electrode region being apart from each other on the first metal thin film layer, the third step is for forming a first electrode and the metal nanostructure which successively lies around the first electrode by annealing the second metal thin film layer formed in the first electrode region, and for forming a second electrode by annealing the second metal thin film layer formed in the second electrode region, and photo-induced current is generated between the first electrode and the second electrode respectively ohmic connected to sites of the conductive thin film layer whose distances from the metal nanostructure are different from each other, by the incident light emitted to the metal nanostructure.

9. The method for manufacturing a thin film photoelectric conversion device according to claim 7 or 8, wherein the substrate is a silicon substrate and the conductive thin film layer is composed of a metal silicide.

10. The method for manufacturing a thin film photoelectric conversion device according to claim 9, wherein a first metal is any of Co, Fe, W, Ni, Al and Ti, and a second metal is any of Au, Ag, Pt, Cu and Pd.

\* \* \* \* \*